United States Patent
Otsuka et al.

(10) Patent No.: US 10,302,681 B2
(45) Date of Patent: May 28, 2019

(54) CURRENT DETECTION CIRCUIT AND SEMICONDUCTOR DEVICE INCLUDING THE SAME

(71) Applicant: Renesas Electronics Corporation, Tokyo (JP)

(72) Inventors: Masanori Otsuka, Tokyo (JP); Wataru Saito, Tokyo (JP); Yoshitaka Jingu, Tokyo (JP); Yasuhiko Kokami, Tokyo (JP); Satoshi Kondo, Tokyo (JP); Junya Horishima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/401,596

(22) Filed: Jan. 9, 2017

(65) Prior Publication Data
US 2017/0212154 A1  Jul. 27, 2017

(30) Foreign Application Priority Data
Jan. 22, 2016 (JP) .................... 2016-010661

(51) Int. Cl.
*G01R 19/32* (2006.01)
*H03K 17/687* (2006.01)
(Continued)

(52) U.S. Cl.
CPC ......... *G01R 19/32* (2013.01); *H03K 17/6872* (2013.01); *F16D 48/06* (2013.01); *F16D 2121/18* (2013.01)

(58) Field of Classification Search
CPC .... G01R 15/18; G01R 15/181; G01R 15/185; G01R 15/186; G01R 19/25; G01R 19/32;
(Continued)

(56) References Cited

U.S. PATENT DOCUMENTS

| | | | |
|---|---|---|---|
| 8,421,441 B2 | 4/2013 | Hirotsu | |
| 2010/0007327 A1* | 1/2010 | Andoh | G01R 31/31924 324/76.11 |
| 2012/0194141 A1* | 8/2012 | Shi | H02M 3/157 320/137 |

FOREIGN PATENT DOCUMENTS

JP  2011-97434 A  5/2011

* cited by examiner

*Primary Examiner* — Son T Le
(74) *Attorney, Agent, or Firm* — McDermott Will & Emery LLP

(57) ABSTRACT

According to one embodiment, a current detection circuit (12) includes: a detection resistor (Rs) provided between a solenoid valve (106) and a solenoid driver (11); an amplification unit (121) configured to amplify a detected voltage of the detection resistor (Rs); an AD converter (122) that is driven by a reference voltage (Vref) generated based on a reference current (Iref) and configured to convert an output voltage from the amplification unit (121) into a digital value and output the digital value as a detected current value (D1); and a correction unit configured to perform a correction on the detected current value (D1). The correction unit includes: a temperature sensor (123); a storage unit (125) configured to store information about temperature characteristics of the detected current value (D1) generated due to temperature characteristics of a reference current in each of two or more different temperature regions; and an operation unit configured to apply, to the detected current value (D1), a first correction coefficient calculated based on a detection result of the temperature sensor (123) and information about temperature characteristics of the detected current value (D1) stored in the storage unit (125).

19 Claims, 15 Drawing Sheets

(51) Int. Cl.
*F16D 48/06* (2006.01)
*F16D 121/18* (2012.01)

(58) Field of Classification Search
CPC ...... G01R 19/2506; G01R 19/00; G01R 1/30;
G01R 19/0092; G01R 33/028; H03K
17/687; F16D 121/18; F16D 48/06
See application file for complete search history.

$$Vod = \frac{-2(Voc - Vic) \cdot (R2 \cdot R3 - R1 \cdot R4) + Vid(R2 \cdot R3 + R1 \cdot R4 + 2R2 \cdot R4) + 2Vofs(R1 + R2) \cdot (R3 + R4)}{2(R1 + R2) \cdot (R3 + R4)/A + 2R1 \cdot R3 + R2 \cdot R3 + R1 \cdot R4}$$

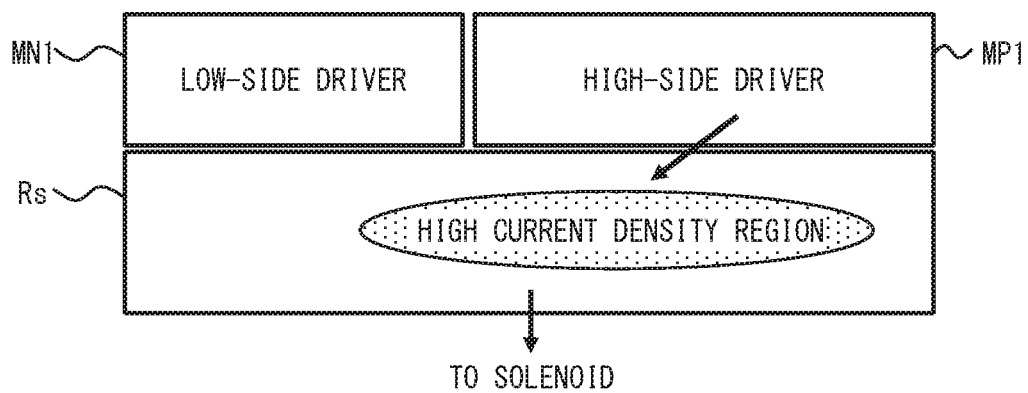
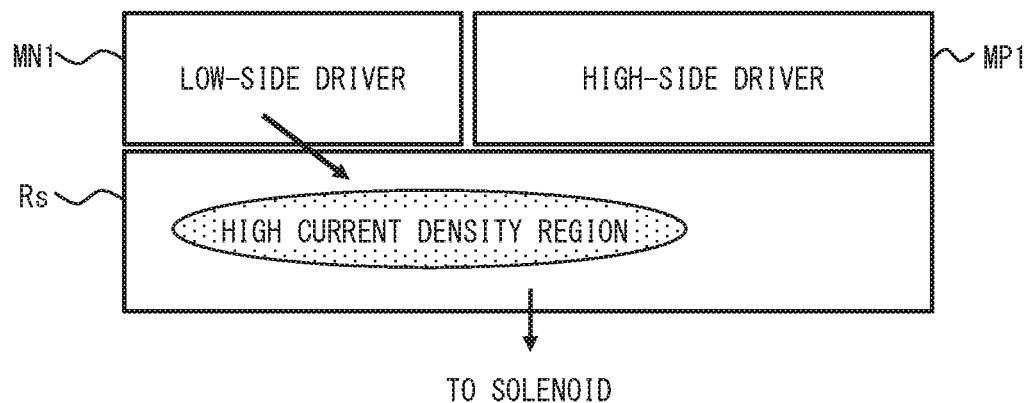
Fig. 16

CURRENT DETECTION CIRCUIT AND SEMICONDUCTOR DEVICE INCLUDING THE SAME

CROSS-REFERENCE TO RELATED APPLICATIONS

This application is based upon and claims the benefit of priority from Japanese patent application No. 2016-010661, filed on Jan. 22, 2016, the disclosure of which is incorporated herein in its entirety by reference.

BACKGROUND

The present invention relates to a current detection circuit and a semiconductor device including the current detection circuit. For example, the present invention relates to a current detection circuit capable of detecting a current with high accuracy, and a semiconductor device including the current detection circuit.

A vehicle has mounted therein an electronic control unit (semiconductor device) that controls the supply of a current to a solenoid valve which controls an opening/closing operation of a clutch. The electronic control unit controls the supply of the current to the solenoid valve to control the opening/closing operation of the clutch, thereby transmitting a driving force of an engine to a transmission or blocking the transmission of the driving force at the time of a starting, stopping, or gear change of the vehicle. In this case, the electronic control unit needs to accurately control the supply of the current to the solenoid valve, to thereby accurately perform the opening/closing operation of the clutch.

For this reason, the electronic control unit s provided with a current detection circuit that detects whether or not the value of a current output from a solenoid driver indicates a normal value. As a matter of course, the current detection circuit is required to have a high current detection accuracy.

Related art is disclosed in Japanese Unexamined Patent Application Publication No. 2011-97434. Japanese Unexamined Patent Application Publication No. 2011-97434 discloses a configuration for correcting fluctuations in the gain and offset of a current detection circuit. With this configuration, the accuracy of current detection by the current detection circuit is improved.

SUMMARY

However, in the current detection circuit disclosed in Japanese Unexamined Patent Application Publication No. 2011-97434, the current detection accuracy of the current detection circuit to be mounted on recent vehicles and the like is insufficient. Other problems to be solved by and novel features of the present invention will become apparent from the following description and the accompanying drawings.

According to one embodiment, a current detection circuit includes: a detection resistor provided between a load and a driver configured to supply a current to the load; an amplification unit configured to amplify a detected voltage generated based on a value of a current flowing to the detection resistor and a resistance value of the detection resistor; an AD converter configured to convert an output voltage from the amplification unit into a digital value and output the digital value as a detected current value, the AD converter being driven by a reference voltage generated based on a reference current and a reference resistance; and a correction unit configured to perform a correction on the detected current value. The correction unit includes: a temperature sensor; a storage unit configured to store information about temperature characteristics of the detected current value generated due to temperature characteristics of the reference current in each of two or more different temperature regions; and an operation unit configured to apply a first correction coefficient to the detected current value, the first correction coefficient being calculated based on a detection result of the temperature sensor and the information about temperature characteristics of the detected current value stored in the storage unit.

According to another embodiment, a current detection circuit includes: a detection resistor provided between a load and a driver configured to supply a current to the load; an amplification unit configured to amplify a detected voltage generated based on a value of a current flowing to the detection resistor and a resistance value of the detection resistor; an AD converter configured to convert an output voltage from the amplification unit into a digital value and output the digital value as a detected current value; and a correction unit configured to perform a correction on the detected current value. The correction unit switches a correction value to be appended to the detected current value, depending on whether the driver supplies the load with a current corresponding to a high-potential-side voltage, or the driver supplies the load with a current corresponding to a low-potential-side voltage.

According to a still further embodiment, a current detection circuit includes: a detection resistor provided between a load and a driver configured to supply a current to the load; an amplification unit configured to amplify a detected voltage generated based on a value of a current flowing to the detection resistor and a resistance value of the detection resistor; and an AD converter configured to convert an output voltage from the amplification unit into a digital value and output the digital value as a detected current value. The detection resistor includes a plurality of resistor elements connected in parallel. The detection resistor outputs detected voltages of some of the plurality of resistor elements selected in advance based on a calculation result or a measurement result of a current flowing to each of the plurality of resistor elements. The amplification unit amplifies an average voltage of the plurality of detected voltages.

According to the one embodiment, it is possible to provide a current detection circuit capable of detecting a current with high accuracy, and a semiconductor device including the current detection circuit.

BRIEF DESCRIPTION OF THE DRAWINGS

The above and other aspects, advantages and features will be more apparent from the following description of certain embodiments taken in conjunction with the accompanying drawings, in which:

FIG. 16 is a diagram schematically showing a high-current-density region in a detection resistor.

DETAILED DESCRIPTION

Figure 1:
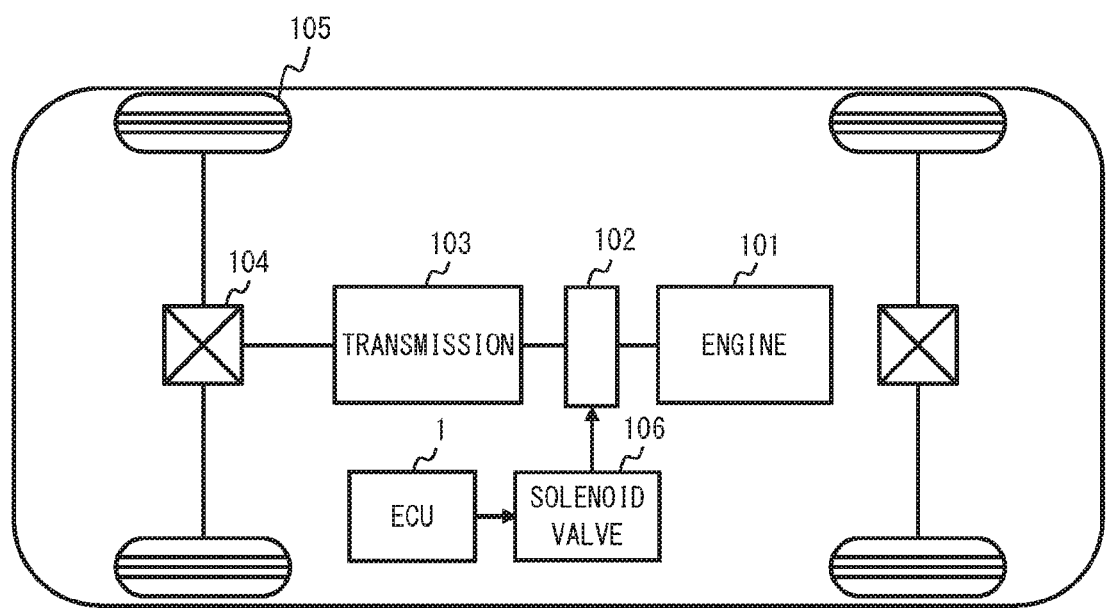
FIG. 1 is an external view showing a vehicle having an electronic control unit mounted therein according to a first embodiment.

Hereinafter, embodiments will be described with reference to the accompanying drawings. The drawings are made in a simplified manner, and therefore the technical scope of embodiments of the invention should not be narrowly interpreted based on the drawings. The same elements are denoted by the same reference numerals, and thus repeated descriptions thereof are omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of some or all of the other, unless otherwise specified. Further, in the following embodiments, when the number of elements (including the number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated or it is theoretically clear that the above is not true. This also applies to the above-mentioned values (including the number of items, numerical value, quantity, range, etc.) and the like.

First Embodiment

FIG. 1 is an external view of a vehicle having an electronic control unit (ECU) mounted therein according to a first embodiment.

As shown in FIG. 1, the vehicle is provided with, for example, an engine 101, a clutch 102, a transmission 103, a differential gear 104, tires 105, a solenoid valve (load) 106, and an electronic control unit (semiconductor device) 1.

For example, the electronic control unit 1 controls the supply of a current to the solenoid valve 106. The solenoid valve 106 converts the supplied current into an electromagnetic force by using an inductor L1 or the like, and then controls an opening/closing operation of the clutch 102 by using the electromagnetic force. Thus, the transmission of the driving force of the engine 101 to the transmission 103 at the time of a starting, stopping, or gear change of the vehicle is controlled. The transmission 103 changes the driving force of the engine 101 to the rotational speed and torque according to the travelling state, and then transmits the rotational speed and torque to the differential gear 104 to thereby rotate the tires 105.

Figure 2:
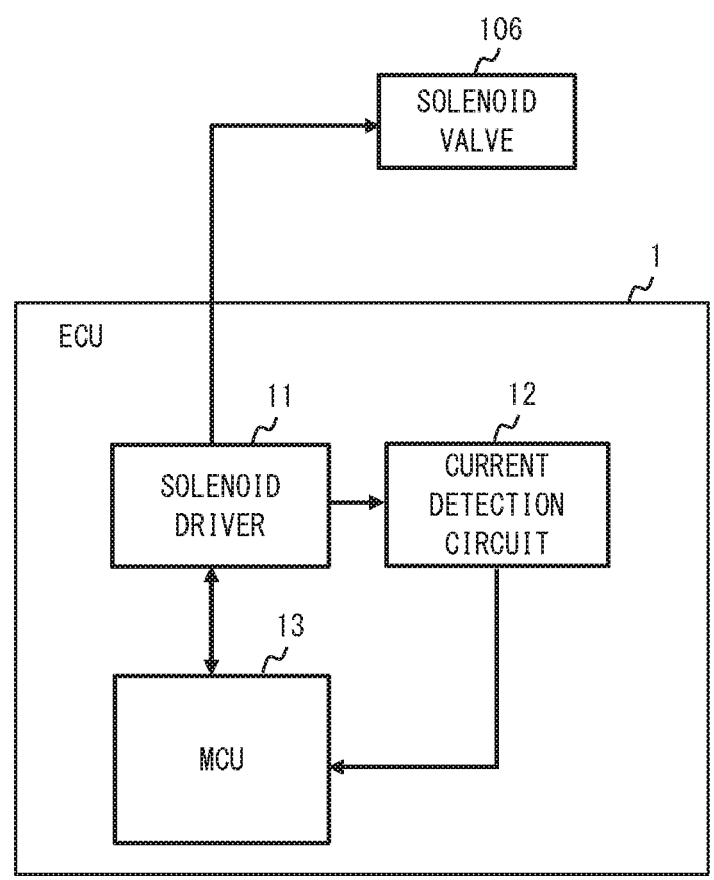
FIG. 2 is a block diagram showing a configuration example of the electronic control unit shown in FIG. 1.

FIG. 2 is a block diagram showing a configuration example of the electronic control unit 1.

As shown in FIG. 2, the electronic control unit 1 includes a solenoid driver 11, a current detection circuit 12, and an MCU (Micro Control Unit) 13.

The solenoid driver 11 outputs a current to the solenoid valve 106. The current detection circuit 12 detects the value of the current output from the solenoid driver 11. The MCU 13 determines whether or not the value of the current output from the solenoid driver 11 falls within the range of the normal value based on the detected current value detected by the current detection circuit 12, and performs a predetermined process. For example, when the value of the output current from the solenoid driver 11 falls outside of the range of the normal value, the MCU 13 controls the current output from the solenoid driver 11 so that the value of the output current falls within the range of the normal value.

In order to improve the accuracy in supplying a current to the solenoid valve 106 to accurately perform the opening/closing operation of the clutch 102, the current detection circuit 12 is required to have a high current detection accuracy.

(Preliminary Review by the Present Inventors)

Prior to giving a detailed description of the current detection circuit 12 mounted on the vehicle and the electronic control unit 1 including the current detection circuit 12, an electronic control unit 50 which has been preliminarily reviewed by the present inventors will be described with reference to FIG. 13.

Figure 13:
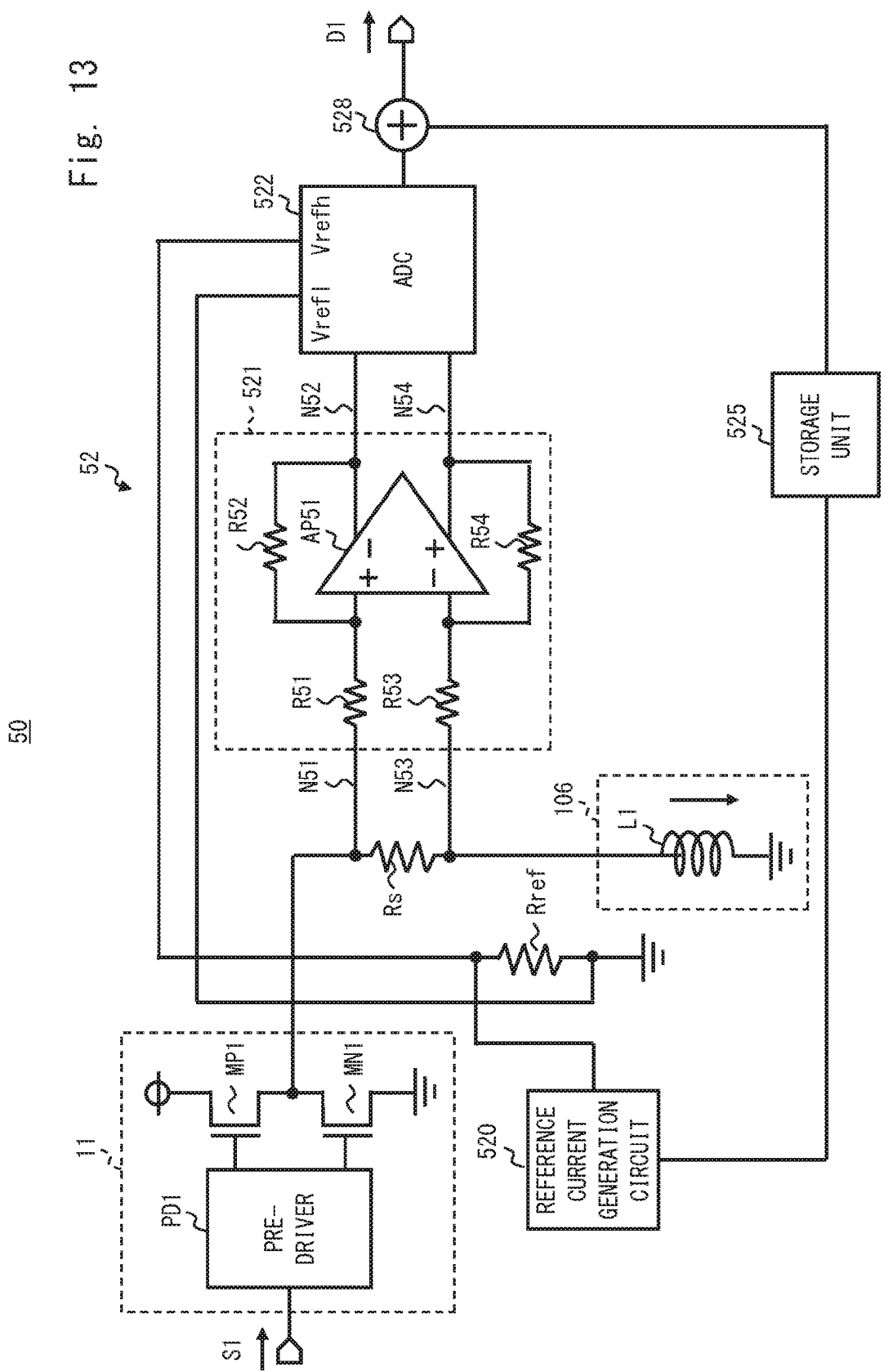
FIG. 13 is a diagram showing a specific configuration example of an electronic control unit according to a concept before the first embodiment was conceived.

FIG. 13 is a diagram showing a specific configuration example of the electronic control unit 50 according to a concept before the first embodiment was conceived. FIG. 13 also shows the solenoid valve (load) 106. The current to be supplied to the solenoid valve 106 is controlled by the electronic control unit 50.

As shown in FIG. 13, the electronic control unit 50 includes the solenoid driver 11, a current detection circuit 52, and the MCU 13 (not shown).

The solenoid driver 11 includes a pre-driver PD1, a high-side driver MP1, and a low-side driver MN1. The pre-driver PD1 drives the high-side driver MP1 and the low-side driver MN1 alternately based on a control signal S1 from the MCU 13 or the like. The high-side driver MP1 is, for example, a P-channel MOS transistor. A current flowing between the source (high-potential-side voltage terminal) of the P-channel MOS transistor, which is supplied with a battery voltage Vbat, and the drain (output terminal of the solenoid driver 11) of the P-channel MOS transistor is controlled based on a drive signal which is supplied from the pre-driver PD1 to the gate of the P-channel MOS transistor. The low-side driver MN1 is, for example, an N-channel MOS transistor. A current flowing between the source (low-potential side voltage terminal) of the N-channel MOS transistor, which is supplied with the ground voltage GND, and the drain (output terminal of the solenoid driver 11) of the N-channel MOS transistor is controlled based on a drive signal which is supplied from the pre-driver PD1 to the gate of the N-channel MOS transistor.

The solenoid valve 106 includes, for example, the inductor L1, and converts the current supplied from the solenoid driver 11 into an electromagnetic force. The solenoid valve 106 controls an oil pressure by using the electromagnetic force, and controls the opening/closing operation of the clutch 102.

The current detection circuit 52 includes a reference current generation circuit 520, a reference resistor Rref, a detection resistor Rs, an amplification unit 521, an AD converter 522, a storage unit 525, and an adder/subtractor 528. The storage unit 525 and the adder/subtractor 528 constitute a correction unit.

A reference current Iref generated by the reference current generation circuit 520 flows to the reference resistor Rref. The reference resistor Rref generates a reference voltage Vref having a voltage level determined based on the resistance value of the reference resistor Rref and the current value of the reference current Iref. The reference voltage Vref is supplied to the AD converter 522 as a drive voltage Vrefh, and the ground voltage GND is supplied to the AD converter 522 as a drive voltage Vrefl.

The detection resistor Rs is provided between the solenoid driver 11 and the solenoid valve 106 and outputs the voltage between the two ends thereof as the detected voltage. The value of the detected voltage is obtained based on the value of the current flowing to the detection resistor Rs (value of current output from the solenoid driver 11) and the resistance value of the detection resistor Rs.

In this case, the detection resistor Rs is provided near the reference resistor Rref so that the detection resistor Rs has substantially the same temperature as that of the reference resistor Rref. Thus, the temperatures of the detection resistor Rs and the reference resistor Rref are set to substantially the same temperature, so that fluctuations in the resistance value due to the temperature characteristics of the detection resistor Rs and the reference resistor Rref can be cancelled out. Further, the detection resistor Rs and the other components of the current detection circuit 52 are mounted on the same chip.

The amplification unit 521 includes resistor elements R51 to R54 and an amplifier AP51. The resistor element R51 is provided between one end of the detection resistor Rs (a terminal located on the output terminal side of the solenoid driver 11; a node N51) and the non-inverted input terminal of the amplifier AP51. The resistor element R53 is provided between the other end of the detection resistor Rs (a terminal on the solenoid valve 106 side; a node N53) and the inverted input terminal of the amplifier AP51. The resistor element R52 is provided between the inverted output terminal (node N52) and the non-inverted input terminal of the amplifier AP51. The resistor element R54 is provided between the non-inverted output terminal (node N54) of the amplifier AP51 and the inverted input terminal thereof.

The amplification unit 521 amplifies the detected voltage, which is output from the detection resistor Rs, to a level suitable for the range of the input voltage of the AD converter 522.

The AD converter 522 is supplied with the reference voltage Vref as the drive voltage Vrefh, and is also supplied with the ground voltage GND as the drive voltage Vrefl, so that the AD converter 522 is driven to convert the output voltage from the amplification unit 521 into a digital value and output the digital value as a detected current value D1.

The reference current Iref generated by the reference current generation circuit 520 has temperature characteristics. The AD converter 522 is driven by the reference voltage Vref corresponding to the reference current Iref. Accordingly, if the reference current Iref has temperature characteristics, the detected current value D1 output from the AD converter 522 also has temperature characteristics. In other words, the AD conversion accuracy of the AD converter 522 deteriorates due to the effect of fluctuations in the reference current Iref caused by a temperature change. This results in degradation of the current detection accuracy of the current detection circuit 52.

In the current detection circuit 52, the reference current generation circuit 520 includes a voltage generation circuit that generates a voltage having a positive temperature dependence and a voltage generation circuit that generates a voltage having a negative temperature dependence. These voltages are added by appropriate weighting and converted into the reference current Iref to be output. An optimum value for the weighting varies due to process variations. Accordingly, the optimum value is measured for each sample before shipment, and is stored in the storage unit 525. For example, two reference current values, i.e., a reference current value during a low temperature and a reference current value during a high temperature, are measured, and a weighting value is determined so that the two reference current values indicate a desired value, and the determined value is stored in the storage unit 525.

Further, in the current detection circuit 52, information (converted into a current value) about an offset voltage of the amplification unit 521 that is measured at a predetermined temperature (at one point) for each sample before shipment is stored in the storage unit 525.

In the actual operation of the current detection circuit 52, the reference current generation circuit 520 generates the reference current Iref optimized based on the weighting information stored in the storage unit 525, and the adder/subtractor 528 subtracts a value corresponding to the offset voltage stored in the storage unit 525 from the detected current value D1 output from the AD converter 522.

However, in the configuration of the current detection circuit 52, the current detection accuracy of the current detection circuit to be mounted on the recent vehicles or the like is insufficient.

Figure 14:
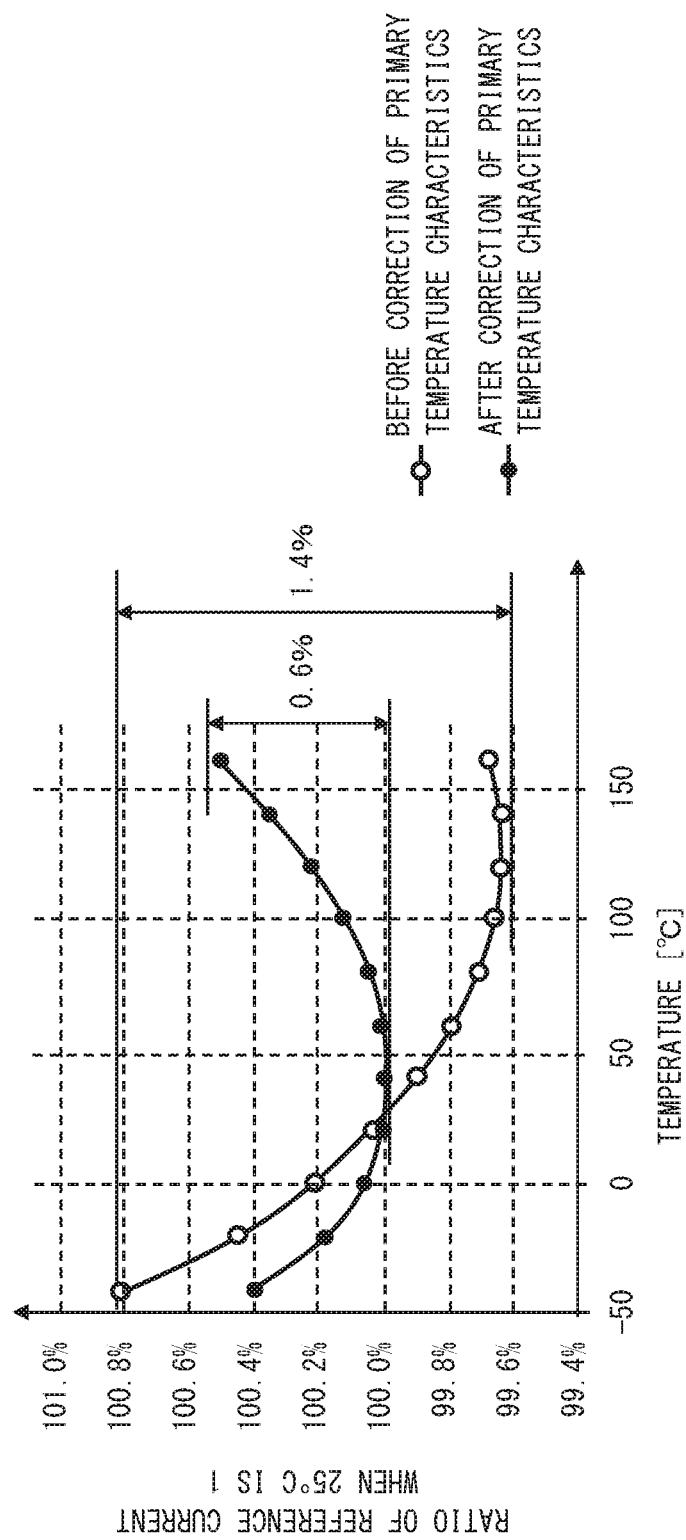
FIG. 14 is a graph showing temperature characteristics of a reference current before and after the correction of primary temperature characteristics.

FIG. 14 is a graph showing temperature characteristics of the reference current value before and after the correction of primary temperature characteristics. Note that the example of FIG. 14 illustrates temperature characteristics of the reference current value when the value of the current to be actually supplied to the solenoid valve 106 (the current is also referred to as a measured current) is fixed to 1.0 A.

As shown in FIG. 14, the reference current value obtained before correcting the primary temperature characteristics has a fluctuation of 1.4% in the range from −40° C. to 150° with respect to the reference current value at 25° C. On the other hand, the reference current value obtained after correcting the primary temperature characteristics has a fluctuation of only 0.6% in the range from −40° C. to 150° C. with respect to the reference current value at 25°. However, in order to suppress fluctuations in the reference current value to 0.5% or less by correction to further improve the current detection accuracy, the correction of only the primary temperature characteristics of the reference current value is insufficient.

In view of the above, the present inventors have found the current detection circuit 12 according to the first embodiment and the electronic control unit 1 including the current detection circuit 12, which are capable of improving the current detection accuracy by correcting the temperature characteristics of the detected current value D1 generated due to the secondary or higher-order temperature characteristics of the reference current value, as well as the primary temperature characteristics of the reference current value.

(The Current Detection Circuit 12 According to the First Embodiment and the Electronic Control Unit 1 Including the Same)

Figure 3:
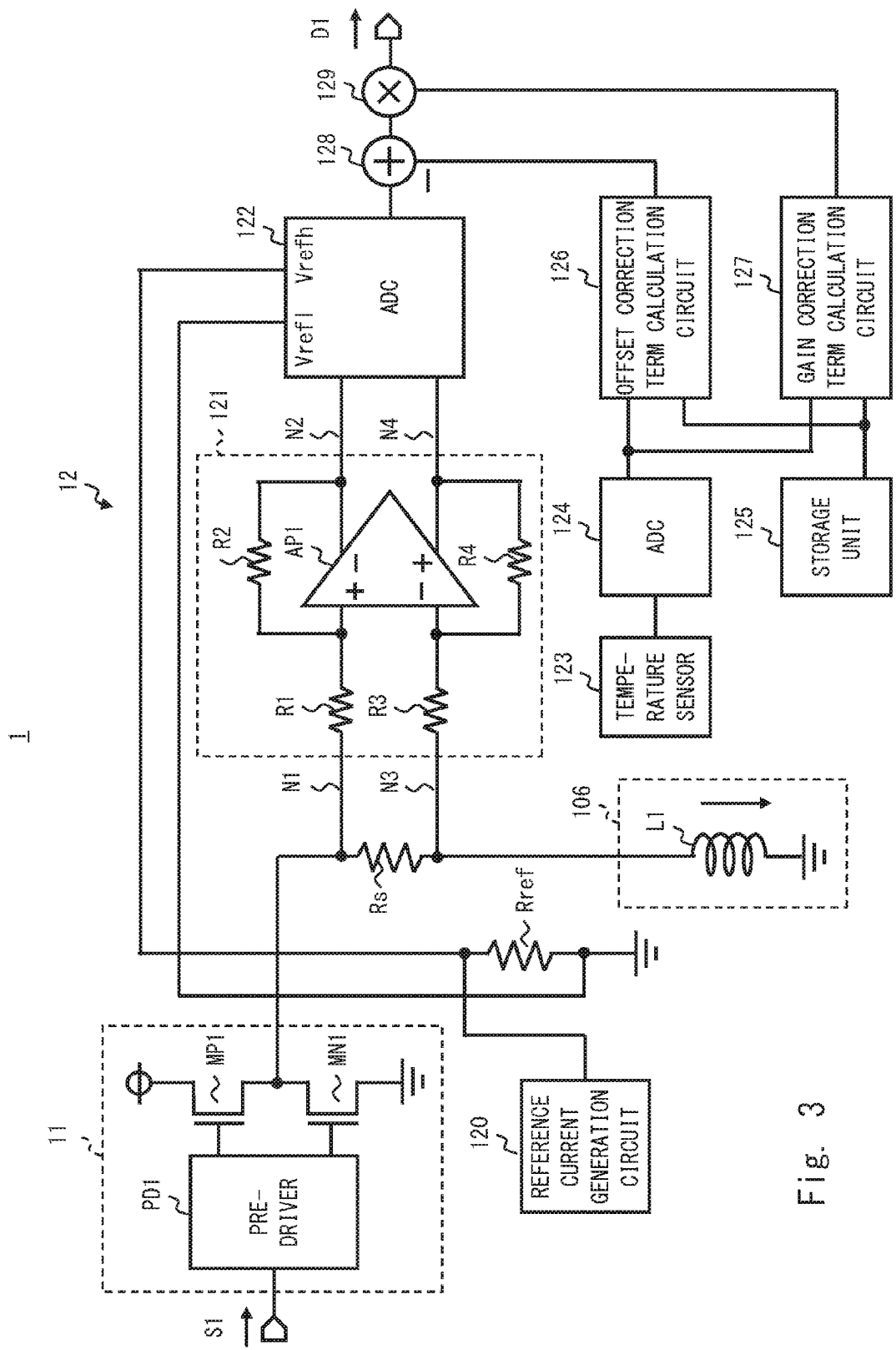
FIG. 3 is a diagram showing a specific configuration example of the electronic control unit shown in FIG. 1.

FIG. 3 is a diagram showing a specific configuration example of the electronic control unit 1. FIG. 3 also shows the solenoid valve (load) 106 which is supplied with a current from the electronic control unit 1.

As shown in FIG. 3, the electronic control unit 1 includes the solenoid driver 11, the current detection circuit 12, and the MCU 13 (not shown). The components other than the current detection circuit 12 the electronic control unit 1 have already been described above. Accordingly, the current detection circuit 12 will be mainly described below.

The current detection circuit 12 includes a reference current generation circuit 120, the reference resistor Rref, the detection resistor Rs, an amplification unit 121, an AD converter 122, a temperature sensor 123, an AD converter 124, a storage unit 125, an offset correction term calculation circuit 126, a gain correction term calculation circuit 127, an adder/subtractor 128, and a multiplier 129. The temperature sensor 123, the AD converter 124, the storage unit 125, the offset correction term calculation circuit 126, the gain correction term calculation circuit 127, the adder/subtractor 128, and the multiplier 129 constitute a correction unit.

The reference current Iref generated by the reference current generation circuit 120 flows to the reference resistor Rref. The reference resistor Rref generates the reference voltage Vref having a voltage level determined based on the resistance value of the reference resistor Rref and the current value of the reference current Iref. The reference voltage Vref is supplied to the AD converter 122 as the drive voltage Vrefh, and the ground voltage GND is also supplied to the AD converter 122 as the drive voltage Vrefl.

The detection resistor Rs is provided between the solenoid driver 11 and the solenoid valve 106 and outputs a voltage between the two ends thereof as a detected voltage. The value of the detected voltage is obtained based on the value of the current flowing to the detection resistor Rs (value of current output from the solenoid driver 11) and the resistance value of the detection resistor Rs.

In this case, the detection resistor Rs is provided near the reference resistor Rref so that the detection resistor Rs has substantially the same temperature as that of the reference resistor Rref. Thus, the temperatures of the detection resistor Rs and the reference resistor Rref are set to substantially the same temperature, so that fluctuations in the resistance value due to the temperature characteristics of the detection resistor Rs and the reference resistor Rref can be cancelled out. Further, the detection resistor Rs and the other components of the current detection circuit 12 are mounted on the same chip.

The amplification unit 121 includes resistor elements R1 to R4 and an amplifier AP1. The resistor element R1 is provided between one end of the detection resistor Rs (a terminal located on the output terminal side of the solenoid driver 11; a node N1) and the non-inverted input terminal of the amplifier AP1. The resistor element R3 is provided between the other end of the detection resistor Rs (a terminal on the solenoid valve 106 side; a node N3) and the inverted input terminal of the amplifier AP1. The resistor element R2 is provided between the inverted output terminal (node N2) of the amplifier AP1 and the non-inverted input terminal thereof. The resistor element R4 is provided between the non-inverted output terminal (node N4) of the amplifier AP1 and the inverted input terminal thereof.

The amplification unit 121 amplifies the detected voltage, which is output from the detection resistor Rs, to a level suitable for the range of the input voltage of the AD converter 122.

The AD converter 122 is supplied with the reference voltage Vref as the drive voltage Vrefh, and is also supplied with the ground voltage GND as the drive voltage Vrefl, so that the AD converter 122 is driven to convert the output voltage from the amplification unit 121 into a digital value and output the digital value as the detected current value D1.

In this case, the reference current Iref generated by the reference current generation circuit 120 has temperature characteristics. The AD converter 122 is driven by the reference voltage Vref corresponding to the reference current Iref. Accordingly, if the reference current Iref has temperature characteristics, the detected current value D1 output from the AD converter 122 also has temperature characteristics.

By utilizing the fact that the reference current value and the gain of the amplification unit 121 have a proportional relationship, the current detection circuit 12 calculates a correction coefficient for correcting the temperature characteristics of the detected current value D1 generated due to the temperature characteristics of the reference current value by using the temperature sensor 123, the AD converter 124, the storage unit 125, the gain correction term calculation circuit 127, and the multiplier 129, which constitute the correction unit, and appends the calculated correction coefficient to the detected current value D1, thereby improving the current detection accuracy.

Specifically, prior to the shipment of the current detection circuit 12, the storage unit 125 stores information about the detected current value D1 which varies in proportional to a temperature change (a variation of the detected current value D1 with respect to a temperature change, and the detected current value D1 at a temperature 0° C.) in each of two or more different temperature regions. In other words, the storage unit 125 stores information about higher-order temperature characteristics of the detected current value D1.

Further, in the actual operation of the current detection circuit 12, the gain correction term calculation circuit 127 calculates the detected current value D1 based on the digital value, which is obtained in such a manner that the AD converter 124 converts the ambient temperature of the reference resistor Rref detected by the temperature sensor 123, and the information which is stored in the storage unit 125 and indicates the temperature characteristics of the detected current value D1 in the temperature region to which the ambient temperature of the reference resistor Rref belongs. After that, the gain correction term calculation circuit 127 outputs, as the correction coefficient, the value obtained by dividing the ideal value (ideal current value) of the reference current Iref by the calculated detected current value D1. The multiplier 129 divides the detected current value D1, which is output from the AD converter 122, by the correction coefficient output from the gain correction term calculation circuit 127, thereby subtracting a value corresponding to fluctuations in the calculated detected current value D1 from the detected current value D1.

Figure 4:
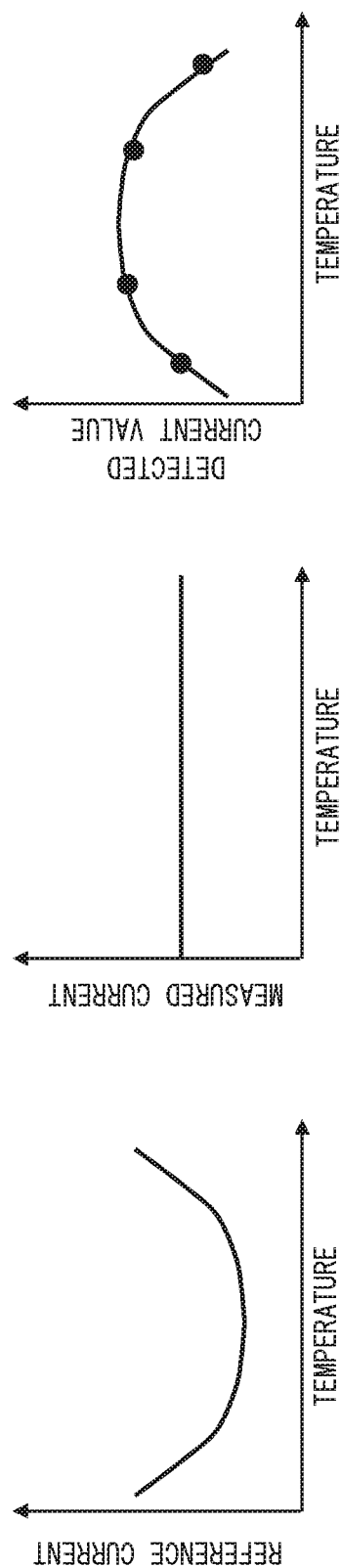
FIG. 4 shows graphs for explaining a method for correcting temperature characteristics of a detected current value generated due to temperature characteristics of a reference current value.
Figure 5:
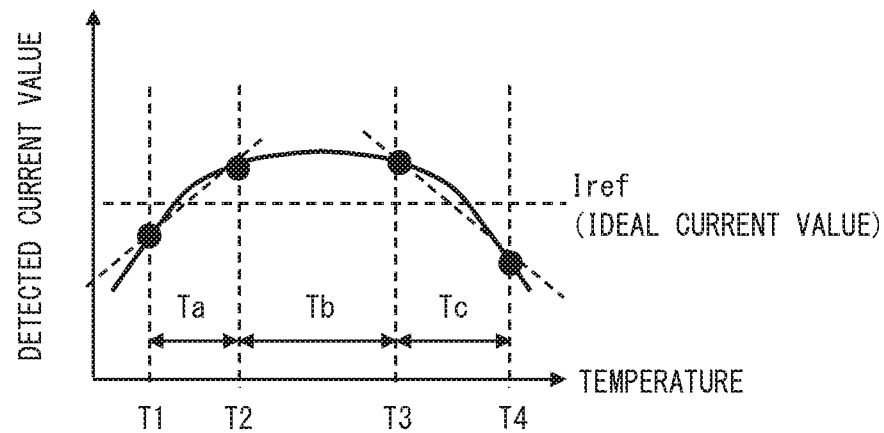
FIG. 5 is a graph for explaining a method for correcting temperature characteristics of the detected current value generated due to temperature characteristics of the reference current value.
Figure 6:
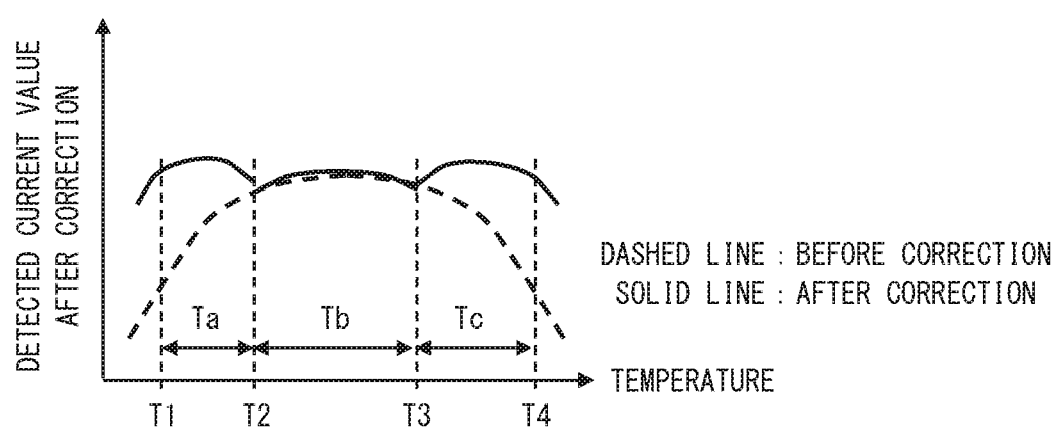
FIG. 6 is a graph for explaining a method for correcting temperature characteristics of the detected current value generated due to temperature characteristics of the reference current value.

Next, a method for correcting the temperature characteristics of the detected current value D1 generated due to the temperature characteristics of the reference current value will be described in detail with reference to FIGS. 4 to 6. FIGS. 4 to 6 are graphs for explaining the method for correcting the temperature characteristics of the detected current value D1 generated due to the temperature characteristics of the reference current value. For ease of explanation, the temperature characteristics of the offset voltage of the amplification unit 121 to be described later are not taken into consideration.

First, an initial measurement of the current detection circuit 12 is carried out before the actual operation during, for example, shipment of products, is started.

In the example of FIG. 4, the detected current value D1 is measured at four different temperatures in a state where the measured current value is fixed. More specifically, the detected current value D1 is measured at a lower-limit end (temperature T1) and an upper-limit end (temperature T4) of a measurement temperature region and at a lower-limit end (temperature T2) and an upper-limit end (temperature T3) of a temperature region in which the detected current value D1 is stabilized in the vicinity of a maximum value, in the state where the measured current value is fixed.

In this case, when the four measured values are obtained for the detected current value D1 in the state where the measured current value is fixed, it is preferable that the four measured values indicate a constant value. However, in practice, the measured values have temperature characteristics due to the effect of the temperature characteristics of the reference current value. Note that the number of points where the measurement is performed is not limited to four, as long as the number of points where the measurement is performed is two or more.

After that, the measurement temperature region is divided into a plurality of different temperature regions. In the example of FIG. 5, the measurement temperature region is divided into three different temperature regions, i.e., a temperature region Ta from the temperature T1 to the temperature T2, a temperature region Tb from the temperature T2 to the temperature T3, and a temperature region Tc from the temperature T3 to the temperature T4. In each of the three different temperature regions, an approximate expression for the detected current value D1 that varies in proportional to a temperature change is specified. The number of temperature regions is not limited to three, as long as the number of temperature regions is two or more. As the number of divided temperature regions is increased, the current detection accuracy is improved. Each point of measurement is not necessarily located on the boundary between the temperature regions.

For example, in the temperature region Ta, the approximate expression of the detected current value=temperature×A1+B1 is specified by a variation A1 of the detected current value when the temperature is changed from the temperature T1 to the temperature T2, and by a detected current value B1 at the temperature 0° C. In the temperature region Tb, the approximate expression of the detected current value=temperature×A2+B2 is specified by a variation A2 of the detected current value when the temperature is changed from the temperature T2 to the temperature T3, and by a detected current value B2 at the temperature 0° C. In the temperature region Tc, the approximate expression of the detected current value=temperature×A3+B3 is specified by a variation A3 of the detected current value when the temperature is changed from the temperature T3 to the temperature T4, and by a detected current value B3 at the temperature 0° C. Information about the variations A1, A2, and A3 of the detected current value with respect to a temperature change and the detected current values B1, B2, and B3 at the temperature 0° in the temperature regions Ta, Tb, and Tc, respectively, is stored in the storage unit 125.

In the subsequent actual operation of the current detection circuit 12, it is first determined that the ambient temperature of the reference resistor Rref, which is detected by the temperature sensor 123, belongs to which one of the temperature regions Ta, Tb, and Tc. The detected current value D1 is calculated by using the approximate expression for the temperature region to which the detected ambient temperature belongs. After that, the ideal value (ideal current value) of the reference current Iref (ideal current value) is divided by the calculated detected current value D1, thereby calculating the correction coefficient. After that, the detected current value D1 output from the AD converter 122 is divided by the correction coefficient output from the gain correction term calculation circuit 127, and a value corresponding to the fluctuations in the calculated detected current value D1 is subtracted from the detected current value D1 (see FIG. 6).

Thus, the current detection circuit 12 and the electronic control unit 1 including the current detection circuit 12 can correct the temperature characteristics of the detected current value D1 generated due to the secondary or higher-order temperature characteristics as well as the primary temperature characteristics of the reference current value, unlike the current detection circuit 52 and the electronic control unit 50. Consequently, the current detection circuit 12 and the electronic control unit 1 including the current detection circuit 12 can further improve the current detection accuracy.

For example, the detected current value calculated in the temperature region Tb is preferably adjusted to be substantially the same value as the ideal value Iref of the reference current Iref. This eliminates the need for correction of the detected current value D1 in the temperature region Tb.

Further, the current detection circuit 12 preferably performs a correction on the temperature characteristics of the detected current value D1 generated due to the temperature characteristics of the offset voltage of the amplification unit 121. In practice, the current detection circuit 12 also performs a correction on the temperature characteristics of the detected current value D1 generated due to the temperature characteristics of the offset voltage of the amplification unit 121. This operation will be described in detail below.

Fluctuations in the detected current value D1 generated due to the temperature characteristics of the offset voltage of the amplification unit 121 are about 0.1 to 0.2% at 3 σ in the measurement temperature region from −40° C. to 150° C. The current detection circuit 12 corrects the fluctuations, so that the temperature characteristics of the detected current value D1 are further reduced, which leads to a further improvement in the current detection accuracy.

The current detection circuit 12 uses the temperature sensor 123, the AD converter 124, the storage unit 125, the offset correction term calculation circuit 126, and the adder/subtractor 128, which constitute the correction unit, to calculate the correction value for correcting the temperature characteristics of the detected current value D1 generated due to the temperature characteristics of the offset voltage, and appends the calculated correction value to the detected current value D1, thereby improving the current detection accuracy.

Specifically, prior to the shipment of the current detection circuit 12, the storage unit 125 stores information about the offset voltage of the amplification unit 121 that varies in proportional to a temperature change (a variation of the offset voltage with respect to a temperature change, and the value of the offset voltage at the temperature 0° C.)

Further, in the actual operation of the current detection circuit 12, the offset correction term calculation circuit 126 calculates a value by converting the offset voltage into a current based on the digital value, which is obtained in such a manner that the AD converter 124 converts the ambient temperature of the reference resistor Rref detected by the temperature sensor 123, and the information about the temperature characteristics of the offset voltage stored in the storage unit 125, and outputs the calculated value. The adder/subtractor 128 subtracts a value corresponding to the offset voltage output from the offset correction term calculation circuit 126 from the detected current value D1 output from the AD converter 122, thereby correcting the detected current value D1. In other words, an operation unit which is composed of the offset correction term calculation circuit 126 and the adder/subtractor 128 corrects the detected current value D1 by appending the correction value, which is calculated based on the detection result of the temperature sensor 123 and the information about the temperature characteristics of the offset voltage stored in the storage unit 125, to the detected current value D1 output from the AD converter 122.

Figure 7:
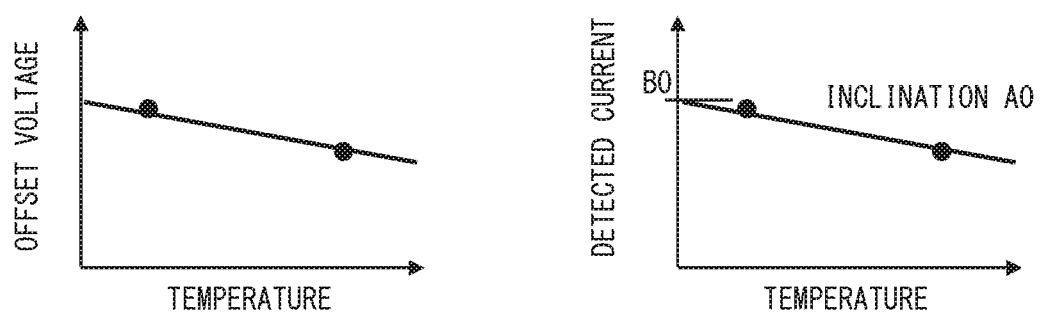
FIG. 7 shows graphs for explaining a method for correcting temperature characteristics of the detected current value generated due to temperature characteristics of an offset voltage.

Next, a method for correcting the temperature characteristics of the detected current value D1 generated due to the temperature characteristics of the offset voltage will be described in detail with reference to FIG. 7. FIG. 7 shows graphs for explaining the method for correcting the temperature characteristics of the detected current value D1 generated due to the temperature characteristics of the offset voltage.

In this case, like the reference current, the offset voltage has a temperature region having positive temperature characteristics and a temperature region having negative temperature characteristics. However, unlike the case of the reference current, it is difficult to correct the individual temperature characteristics of the offset voltage in each temperature region after the measurement temperature region is divided into a plurality of temperature regions. Accordingly, it is more effective to perform addition/subtraction of the correction value on the digital detected current value D1, instead of performing the correction in an analog manner.

First, an initial measurement of the current detection circuit 12 is carried out before the actual operation during, for example, shipment of products, is started.

In the example of FIG. 7, the detected current value D1 is measured at two different temperatures (for example, an ordinary temperature and a high temperature) in a state where the measured current value is fixed to zero. Thus, only fluctuation components due to the offset voltage appear in the detected current value D1. The number of points where the measurement is performed is not limited to two, but instead may be three or more.

After that, an approximate expression for the detected current value D1 that varies in proportional to a temperature change is specified.

For example, the approximate expression of the detected current value (corresponding to the offset voltage)=temperature×A0+B0 is specified by a variation A0 (corresponding to a variation of the offset voltage) of the detected current value when the temperature is changed from the ordinary temperature to the high temperature, and by a detected current value B0 at the temperature 0° C. (corresponding to the offset voltage at the temperature 0° C.) Information about the variation A0 of the detected current value with respect to a temperature change and the detected current value B0 at the temperature 0° C. is stored in the storage unit 125.

In the subsequent actual operation of the current detection circuit 12, the ambient temperature of the reference resistor Rref detected by the temperature sensor 123 is first substituted into the above approximate expression, to thereby calculate a current value which is converted from the offset value. After that, a value corresponding to the offset voltage output from the offset correction term calculation circuit 126 is subtracted from the detected current value D1 output from the AD converter 122, thereby correcting the detected current value D1.

Thus, the current detection circuit 12 and the electronic control unit 1 including the current detection circuit 12 can correct not only the temperature characteristics of the detected current value D1 generated due to the temperature characteristics of the reference current value, but also the temperature characteristics of the detected current value D1 generated due to the temperature characteristics of the offset voltage of the amplification unit 121, which leads to a further improvement in the current detection accuracy.

In practice, after the temperature characteristics of the detected current value D1 generated due to the temperature characteristics of the offset voltage are corrected, the temperature characteristics of the detected current value D1 generated due to the temperature characteristics of the reference current value are corrected.

Second Embodiment

Figure 8:
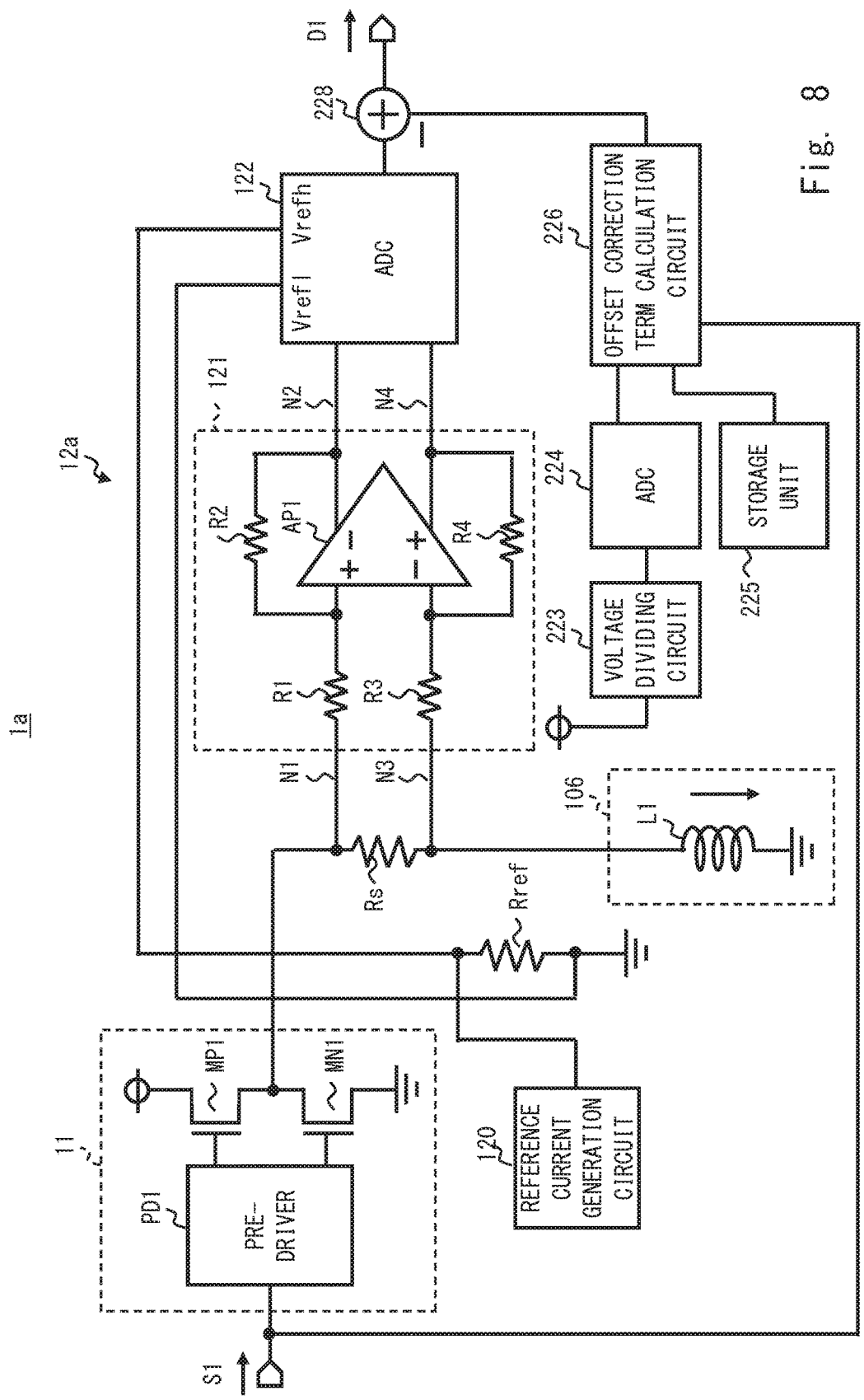
FIG. 8 is a diagram showing a specific configuration example of an electronic control unit according to a second embodiment.

FIG. 8 is a diagram showing a specific configuration example of an electronic control unit 1a according to a second embodiment. FIG. 8 also shows the solenoid valve (load) 106 which is supplied with a current from the electronic control unit 1a.

The electronic control unit 1a differs from the electronic control unit 1 in that a current detection circuit 12a is provided instead of the current detection circuit 12. The configuration of the correction unit provided in the current detection circuit 12a is different from that of the current detection circuit 12.

In this case, the offset voltage of the amplification unit 121 may vary depending on a central potential of differential input signals (an average value between a potential to be input to the non-inverted input terminal and a potential to be input to the inverted input terminal).

Figure 9:
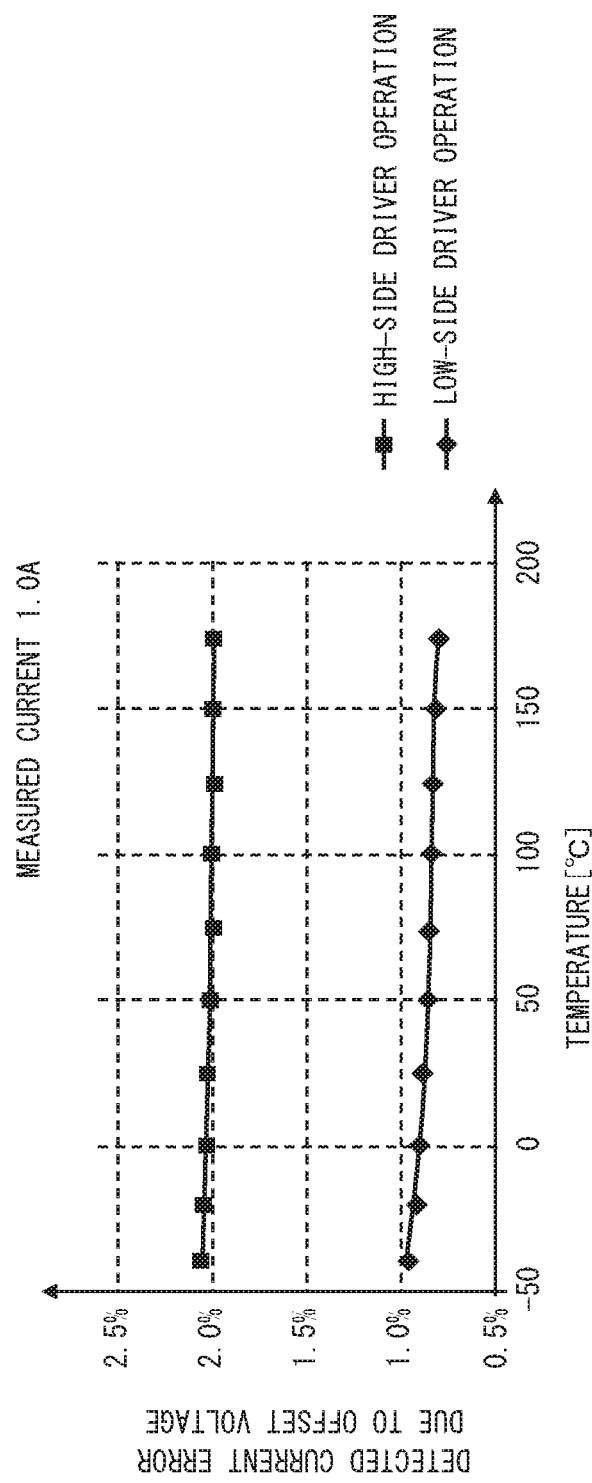
FIG. 9 is a graph showing an error between a detected current value due to an offset value during a high-side driver operation and a detected current value due to an offset value during a low-side driver operation.

FIG. 9 is a graph showing an error between the detected current value due to the offset voltage during a high-side driver operation and the detected current value due to the offset voltage during a low-side driver operation. Referring to FIG. 9, there is a difference of about 1% between the error of the detected current value D1 due to the offset voltage during the operation of the high-side driver MP1 and the error of the detected current value D1 due to the offset voltage during the operation of the low-side driver MN1. This indicates that the offset voltage of the amplification unit 121 when the central potential of the differential input signals of the amplification unit 121 during the operation of the high-side driver MP1 becomes a high potential is different from the offset voltage of the amplification unit 121 when the central potential of the differential input signals of the amplification unit 121 during the operation of the low-side driver NM1 becomes a low potential. Accordingly, the correction unit provided in the current detection circuit 12a corrects the detected current value D1 in consideration of the offset voltage that varies depending on the operating state of the solenoid driver 11.

Specifically, the correction unit includes a voltage dividing circuit 223, an AD converter 224, a storage unit 225, an offset correction term calculation circuit 226, and an adder/subtractor 228.

Prior to the shipment of the current detection circuit 12a, the storage unit 225 stores information about the offset voltage during the operation of the high-side driver MP1 and information about the offset voltage during the operation of the low-side driver MN1. In addition, the storage unit 225 stores information about the resistance values of the resistor elements R1 to R4 provided in the amplification unit 121.

The voltage dividing circuit 223 divides the battery voltage Vbat and outputs the divided voltage. The AD converter 224 converts the output voltage from the voltage dividing circuit 223 into a digital value, and outputs the digital value. The value of the battery voltage Vbat is measured from the output value of the AD converter 122.

Figure 10:
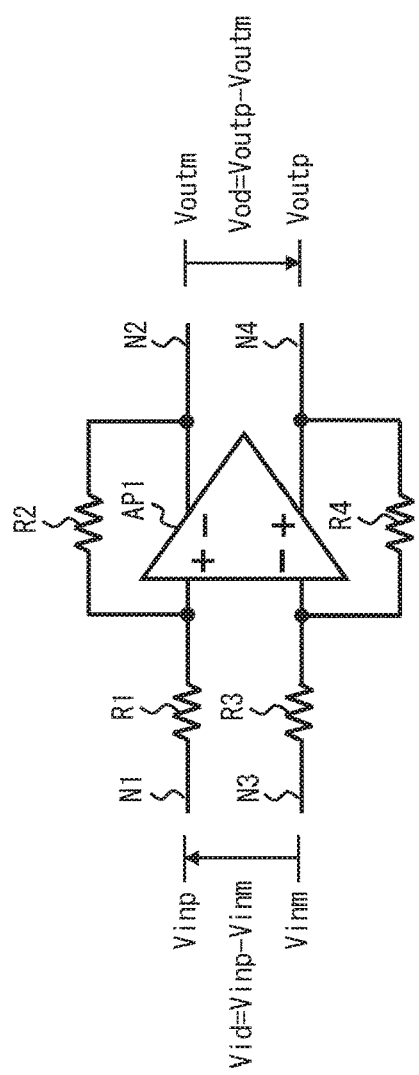
FIG. 10 is a diagram for explaining a method for calculating an offset voltage of an amplification unit that varies depending on an operating state of a driver.

The offset correction term calculation circuit 226 determines which one of the high-side driver MP1 and the low-side driver MN1 is operating based on the control signal S1, and substitutes a central potential Vic corresponding to the determination result into a formula shown in FIG. 10, thereby calculating the offset voltage of the amplification unit 121.

In the formula shown in FIG. 10,

R1 to R14 represent the resistance values of the resistor elements R1 to R4, respectively;

A represents the raw gain of the amplifier AP1;

Vofs represents the (input-referred) offset voltage of the amplifier AP1;

Vid represents a differential input voltage (Vid=Vinp−Vinm);

Vic represents an in-phase input voltage (Vic=(Vinp+Vinm)/2);

Vod represents a differential output voltage (Vod=Voutp−Voutm); and

Voc represents an in-phase output voltage (Voc=(Voutp+Voutm)/2).

The second term in the numerator of the formula shown in FIG. 10 is a term obtained by multiplying the differential input voltage Vid by a coefficient and represents the original amplification operation. The third term in the numerator is a term representing the offset voltage of the amplifier AP1, and is corrected by, for example, the correction method described in the first embodiment. The first term in the numerator is a term representing the offset voltage that is proportional to a difference voltage between the central potential Voc of the differential output signals and the central potential Vic of the differential input signals.

In this case, the central potential Voc of the differential output signals is kept at a constant level, while the central potential Vic of the differential input signals varies depending on the operating state of the solenoid driver 11. Specifically, the central potential Vic of the differential input signals indicates a level in the vicinity of the battery voltage Vbat during the operation of the high-side driver MP1, and indicates a level in the vicinity of the ground voltage GND during the operation of the low-side driver MN1. Accordingly, for example, the measured value of the battery voltage Vbat is substituted into the central potential Vic of the differential input signals during the operation of the high-side driver MP1, and the value "0" is substituted into the central potential Vic of the differential input signals during the operation of the low-side driver MN1. In other words, the first term in the numerator is a term representing the offset voltage that varies depending on the operating state of the solenoid driver 11.

The battery voltage Vbat is, for example, 12 V, and varies depending on the load or charging state. Accordingly, the use of the value of the battery voltage Vbat measured in real time enables a more accurate calculation of the offset voltage.

The adder/subtractor 228 subtracts the current conversion value of the offset voltage, which is calculated by the offset correction term calculation circuit 226, from the detected current value D1 output from the AD converter 122, thereby correcting the detected current value D1. In other words, the operation unit including the offset correction term calculation circuit 226 and the adder/subtractor 228 corrects the detected current value D1 by appending the correction value, which is switched depending on the operating state of the solenoid driver 11, to the detected current value D1 output from the AD converter 122.

In this manner, the current detection circuit 12a according to the second embodiment and the electronic control unit 1a including the current detection circuit 12a can suppress the effect of the offset voltage, which varies depending on the operating state of the solenoid driver 11, by switching the correction value to be appended to the detected current value D1 depending on the operating state of the solenoid driver 11, thereby making it possible to improve the current detection accuracy.

In particular, during the operation of the high-side driver MP1, the amplification unit 121 is supplied with the battery voltage Vbat of about 12 V, so that the absolute value of the offset voltage becomes large, which has a great influence on the current detection accuracy. Therefore, the correction of the detected current value D1 depending on the operating state of the solenoid driver 11 is particularly effective for improving the accuracy during the operation of the high-side driver MP1.

The correction units provided in the current detection circuits 12 and 12a, respectively, may be used singly or in combination.

Third Embodiment

Figure 11:
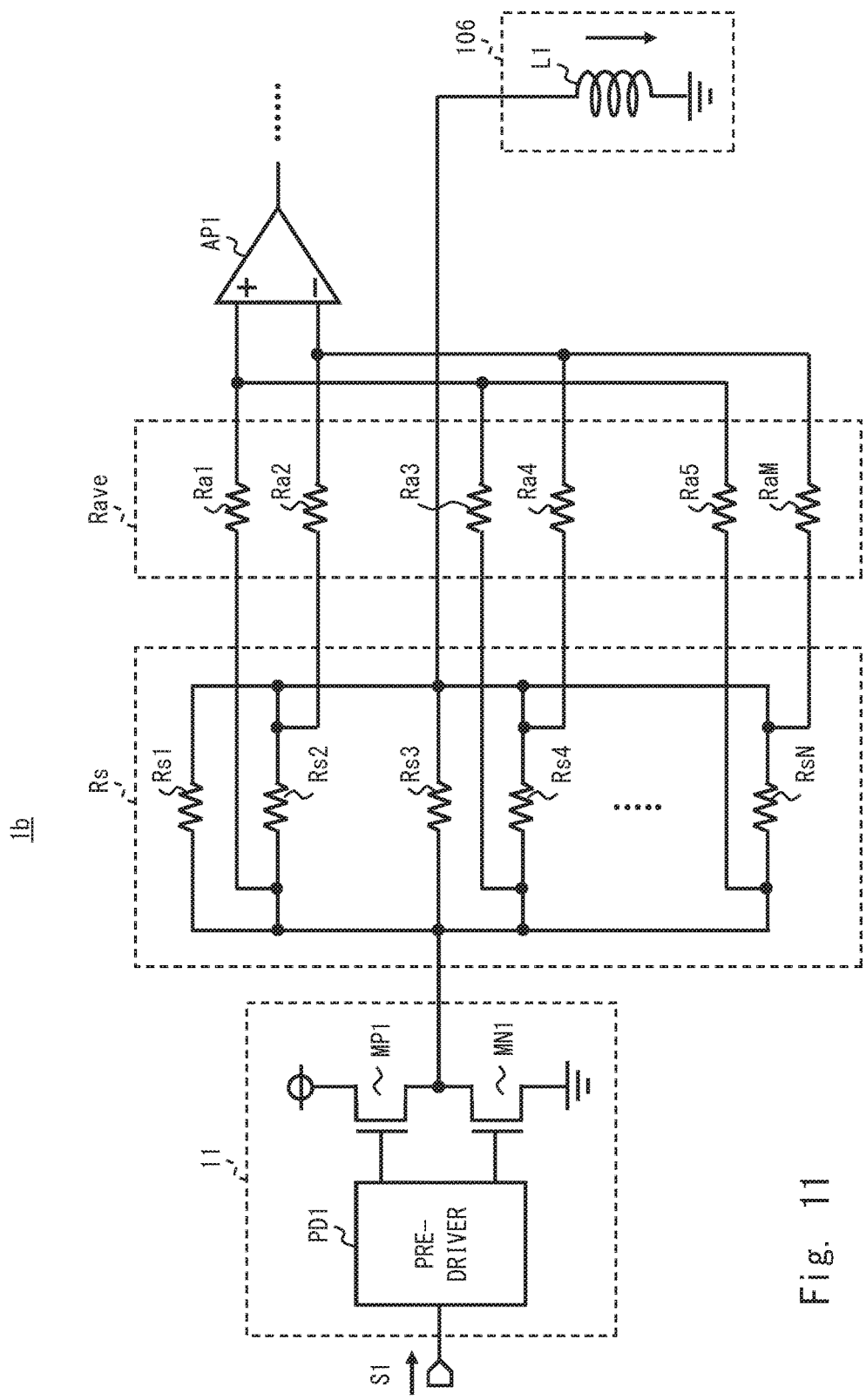
FIG. 11 is a diagram showing a specific configuration example of an electronic control unit according to a third embodiment.

FIG. 11 is a diagram showing a part of a specific configuration example of an electronic control unit 1b according to a third embodiment. FIG. 11 also shows the solenoid valve (load) 106 which is supplied with a current from the electronic control unit 1b.

As shown in FIG. 11, in the electronic control unit 1b, a specific configuration of the detection resistor Rs is illustrated and an averaging resistor Rave which is composed of a plurality of resistor elements Ra1 to RaM and Rb1 to Rb1M (M is any integer equal to or greater than 2) is additionally provided. The other components of the electronic control unit 1b are basically similar to those of the electronic control units 1, 1a, and the like, and thus the descriptions thereof are omitted.

The detection resistor Rs is composed of a large number of unit resistors Rs1 to RsN (N is any integer equal to or greater than 2), which are connected in parallel, so as to treat a detected current indicating a large value, such as several amperes.

For example, when the detection resistor Rs needs to detect a current of 1.0 A at maximum, a current flowing to each of the unit resistors Rs1 to RsN is suppressed to about 100 uA in consideration of the reliability. Accordingly, the detection resistor Rs is composed of 10,000 unit resistors. At this time, it is unrealistic that the detected voltage is extracted from all the 10,000 unit resistors and the average voltage of the extracted voltages is supplied to the amplification unit 121. Therefore, the detected voltage is extracted from some of the 10,000 unit resistors and the average voltage of the extracted voltages is supplied to the amplification unit 121.

Figure 15:
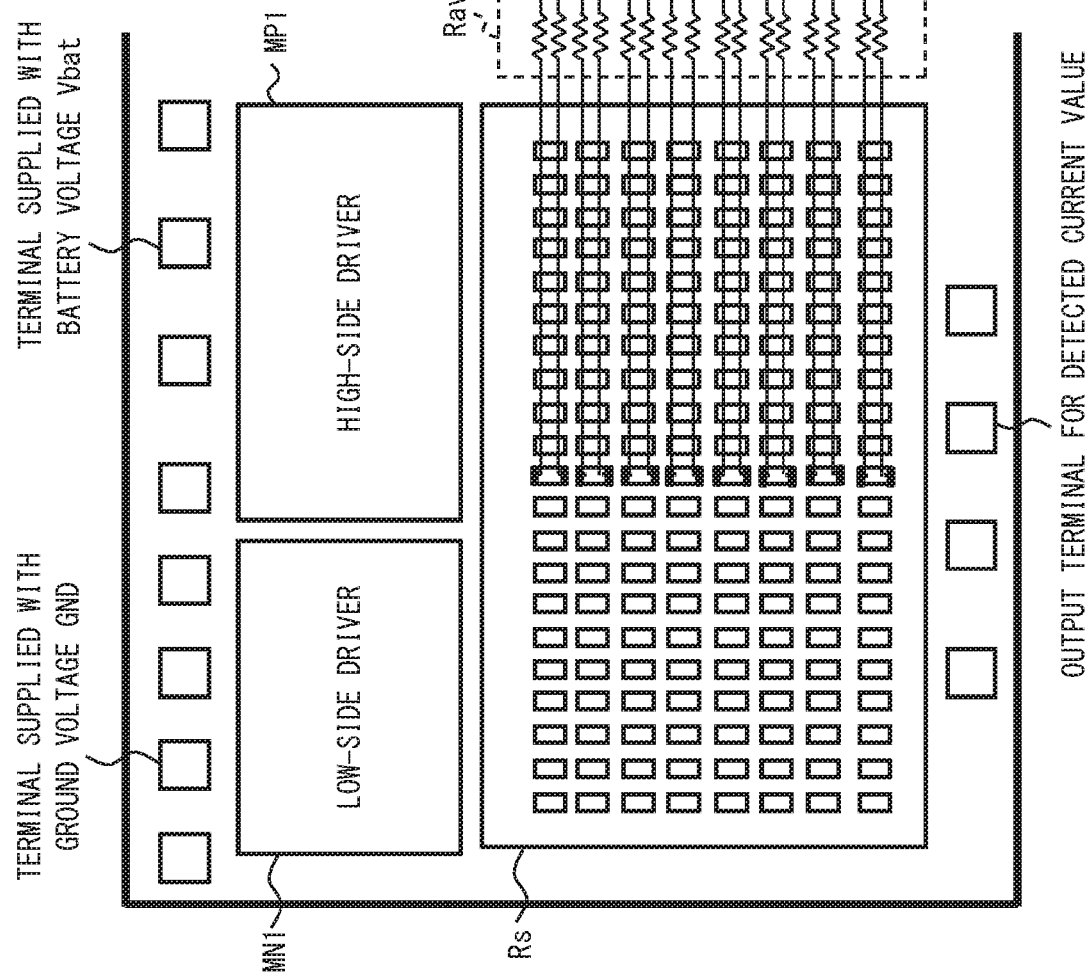
FIG. 15 is a plan view schematically showing a part of an electronic control unit according to a concept before the third embodiment was conceived.

FIG. 15 is a plan view schematically showing a part of the electronic control unit according to a concept before the third embodiment was conceived. Referring to FIG. 15, the low-side driver MN1 is disposed on an upper left portion of the chip and the high-side driver MP1 is disposed on an upper right portion of the chip. In a lower portion of the chip, the detection resistor Rs which is composed of the plurality of unit resistors Rs1 to RsN that are arranged in a matrix is disposed. In this case, in the example of FIG. 15, a plurality of unit resistors arranged in a central row among the plurality of unit resistors arranged in a matrix are selected as the unit resistors from which the detected voltage is to be extracted. Thus, the distances between the amplifier AP1 and the plurality of unit resistors selected as the unit resistors from which the detected voltage is to be extracted become substantially the same. In other words, the lengths of lines connecting the amplifier AP1 and the plurality of unit resistors selected as the unit resistors from which the detected voltage is to be extracted become substantially the same.

However, referring to FIG. 16, the current density in the detection resistor Rs is not always uniform due to the effect of, for example, the positional relationship between the high-side driver MP1 and the low-side driver MN1. The region in which high current densities are distributed during the operation of the high-side driver MP1 is different from the region in which high current densities are distributed during the operation of the low-side driver MN1. Accordingly, if a plurality of unit resistors arranged in a central row are simply selected as the unit resistors from which the detected voltage is to be extracted, for example, only the unit resistors in the high current density region may be selected. In that case, the average voltage greatly deviates from the average value of the detected voltages extracted from all the unit resistors constituting the detection resistor Rs.

Figure 12:
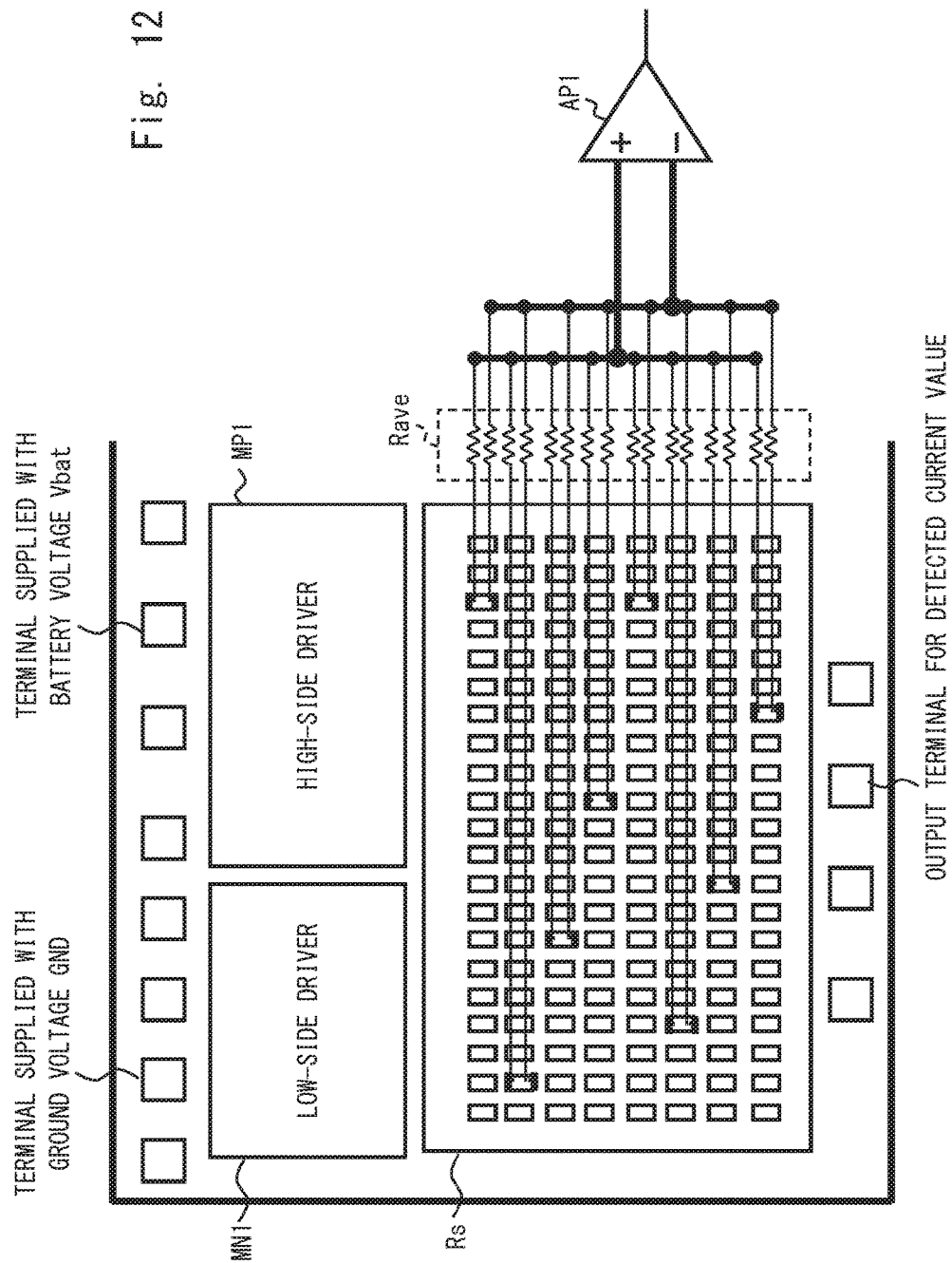
FIG. 12 is a plan view schematically showing a part of the electronic control unit shown in FIG. 11.

In the third embodiment, prior to the shipment of the current detection circuit 12b, the value of the current flowing to each of the plurality of unit resistors Rs1 to RsN is measured or calculated, and the unit resistors from which the detected voltage is to be extracted are selected based on the measurement result or the calculation result (see FIG. 12).

At this time, it is preferable to select the unit resistors having small fluctuations in the detected voltage even when the operating state of the solenoid driver 11 is changed.

More specifically, for example, a circuit simulation is executed using a net list to which wiring parasitic resistances are added, and based on the result, the unit resistors having a measured current value that matches the average value of the detected currents of the detection resistor Rs are selected as the unit resistors from which the detected voltage is to be extracted.

The averaging resistor Rave for averaging the wiring parasitic resistances is provided on each line path between the amplifier AP1 and each of the unit resistors selected as the unit resistors from which the detected voltage is to be extracted. More specifically, the resistor elements Ra1 to RaM having a resistance value large enough to neglect the wiring parasitic resistances are provided on each line path between the amplifier AP1 and the plurality of unit resistors selected as the unit resistors from which the detected voltage is to be extracted. Thus, the effects of the wiring parasitic resistances are suppressed, and the uneven current densities in the selected unit resistors are averaged. Consequently, the degradation in the current detection accuracy is suppressed. This is especially effective when the input resistance of the amplifier AP1 is small.

In this manner, the current detection circuit 12b according to the third embodiment and the electronic control unit 1b including the current detection circuit 12b select some of the unit resistors as the unit resistors from which the detected voltage is to be extracted, based on the measurement result or the calculation result of the current flowing to each of the plurality of unit resistors Rs1 to RsN constituting the detection resistor Rs. This allows the average value of the detected voltages extracted from the selected unit resistors to approach the average value of the detected voltages extracted from all the unit resistors constituting the detection resistor Rs, which leads to an improvement in the current detection accuracy. The averaging resistor Rave is provided on each line path between the amplifier AP1 and the selected unit resistors. With this configuration, the wiring parasitic resistances are averaged, so that the degradation of the current detection accuracy can be suppressed.

The configurations of the detection resistor Rs and the averaging resistor Rave of the current detection circuit 12b may be incorporated in the current detection circuits 12 and 12a.

As described above, the current detection circuits according to the first to third embodiments and the electronic control units including the current detection circuits can improve the current detection accuracy by, for example, correcting the temperature characteristics of the detected current value D1 generated due to the higher-order temperature characteristics of the reference current value, correcting the offset voltage that varies depending on the operating state of the solenoid driver 11, or devising ways of selecting unit resistors as the unit resistors from which the detected voltage is to be extracted among the plurality of unit resistors constituting the detection resistor Rs.

The invention made by the present inventors has been described in detail above with reference to embodiments. However, the present invention is not limited to the embodiments described above and can be modified in various ways without departing from the scope of the invention.

For example, in the current detection circuits according to the first to third embodiments and the electronic control units including the current detection circuits, the conductivity type (p-type or n-type) of a semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A current detection circuit comprising:
a detection resistor provided between a load and a driver configured to supply a current to the load;
an amplifier configured to amplify a detected voltage generated based on a value of a current flowing to the detection resistor and a resistance value of the detection resistor;
an AD converter configured to convert an output voltage from the amplifier into a digital value and output the digital value as a detected current value, the AD converter being driven by a reference voltage generated based on a reference current and a reference resistance;
a storage configured to store information about temperature characteristics of the detected current value generated due to temperature characteristics of the reference current in each of two or more different temperature regions; and
a correction circuit configured to perform a correction on the detected current value by applying a first correction coefficient to the detected current value, the first correction coefficient being calculated based on a detection result of a temperature sensor and the information about temperature characteristics of the detected current value stored in the storage.

2. The current detection circuit according to claim 1, wherein
the storage further stores information about temperature characteristics of an offset voltage of the amplifier, and
the correction circuit operation unit appends, to the detected current value, a correction value calculated based on the detection result of the temperature sensor and the offset voltage of the amplifier stored in the storage, and appends the first correction coefficient to the detected current value to which the correction value is appended.

3. The current detection circuit according to claim 1, wherein the correction circuit switches a correction value to be appended to the detected current value, depending on whether the driver supplies the load with a current corresponding to a high-potential-side voltage, or the driver supplies the load with a current corresponding to a low-potential-side voltage.

4. The current detection circuit according to claim 1, wherein the detection resistor includes a plurality of resistor elements connected in parallel,
the detection resistor outputs detected voltages of some of the plurality of resistor elements selected in advance based on a measurement result or a calculation result of a current flowing to each of the plurality of resistor elements, and
the amplifier amplifies an average voltage of the plurality of detected voltages.

5. The current detection circuit according to claim 4, further comprising an averaging resistor configured to average effects of parasitic resistances in the respective detected voltages selected in the detection resistor.

6. The current detection circuit according to claim 1, wherein the load is a solenoid valve.

7. A semiconductor device comprising:
the current detection circuit according to claim 1; and
the driver.

8. The semiconductor device according to claim 7, wherein the driver includes:
a P-channel MOS transistor provided between a first power supply terminal and an output terminal, the first power supply terminal being supplied with a high-potential-side voltage; and
an N-channel MOS transistor provided between a second power supply terminal and the output terminal, the second power supply terminal being supplied with a low-potential-side voltage.

9. A current detection circuit comprising:
a detection resistor provided between a load and a driver configured to supply a current to the load;
an amplifier configured to amplify a detected voltage generated based on a value of a current flowing to the detection resistor and a resistance value of the detection resistor;
an AD converter configured to convert an output voltage from the amplifier into a digital value and output the digital value as a detected current value; and
a correction circuit configured to perform a correction on the detected current value,
wherein the correction circuit switches a correction value to be appended to the detected current value, depending on whether the driver supplies the load with a current corresponding to a high-potential-side voltage, or the driver supplies the load with a current corresponding to a low-potential-side voltage.

10. The current detection circuit according to claim 9, wherein the load is a solenoid valve.

11. A semiconductor device comprising:
the current detection circuit according to claim 9; and
the driver.

12. The semiconductor device according to claim 11, wherein the driver includes:
a P-channel MOS transistor provided between a first power supply terminal and an output terminal, the first power supply terminal being supplied with a high-potential-side voltage; and
an N-channel MOS transistor provided between a second power supply terminal and the output terminal, the second power supply terminal being supplied with a low-potential-side voltage.

13. The current detection circuit according to claim 9, further comprising:
an adder, which adds a correction value to the detected current value, the correction value calculated based on a detection result of a temperature sensor and an offset voltage of the amplifier stored in a storage.

14. A current detection circuit comprising:
- a detection resistor provided between a load and a driver configured to supply a current to the load;
- an amplification unit configured to amplify a detected voltage generated based on a value of a current flowing to the detection resistor and a resistance value of the detection resistor; and
- an AD converter configured to convert an output voltage from the amplifier into a digital value and output the digital value as a detected current value, wherein
- the detection resistor includes a plurality of resistor elements connected in parallel,
- the detection resistor outputs detected voltages of some of the plurality of resistor elements selected in advance based on a calculation result or a measurement result of a current flowing to each of the plurality of resistor elements, and
- the amplifier amplifies an average voltage of the plurality of detected voltages.

15. The current detection circuit according to claim 14, wherein the detection resistor outputs detected voltages of some of the plurality of resistor elements selected in advance based on a value of a current flowing to each of the plurality of resistor elements when the driver supplies the load with a current corresponding to a high-potential-side voltage, and based on a value of a current flowing to each of the plurality of resistor elements when the driver supplies the load with a current corresponding to a low-potential-side voltage.

16. The current detection circuit according to claim 14, further comprising an averaging resistor configured to average effects of parasitic resistances in the respective detected voltages selected in the detection resistor.

17. The current detection circuit according to claim 14, wherein the load is a solenoid valve.

18. A semiconductor device comprising:
- the current detection circuit according to claim 14; and
- the driver.

19. The semiconductor device according to claim 18, wherein the driver includes:
- a P-channel MOS transistor provided between a first power supply terminal and an output terminal, the first power supply terminal being supplied with a high-potential-side voltage; and
- an N-channel MOS transistor provided between a second power supply terminal and the output terminal, the second power supply terminal being supplied with a low-potential-side voltage.

* * * * *